US010170229B2

(12) United States Patent
Jeong

(10) Patent No.: US 10,170,229 B2
(45) Date of Patent: Jan. 1, 2019

(54) CHIP ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventor: Dong Jin Jeong, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 455 days.

(21) Appl. No.: 14/692,701

(22) Filed: Apr. 21, 2015

(65) Prior Publication Data

US 2016/0086719 A1 Mar. 24, 2016

(30) Foreign Application Priority Data

Sep. 18, 2014 (KR) ........................ 10-2014-0124380

(51) Int. Cl.
*H01F 17/00* (2006.01)
*H01F 17/04* (2006.01)
(Continued)

(52) U.S. Cl.
CPC ......... *H01F 17/0013* (2013.01); *H01F 17/04* (2013.01); *H01F 27/292* (2013.01);
(Continued)

(58) Field of Classification Search
CPC ................................... H01F 5/00; H01F 27/28
(Continued)

(56) References Cited

U.S. PATENT DOCUMENTS 6,675,462 B1 * 1/2004 Takahashi ........... H01F 17/0013 29/602.1
7,772,674 B2 8/2010 Asahi
(Continued)

FOREIGN PATENT DOCUMENTS

JP H08-055726 A 2/1996
JP 09045531 A * 2/1997
(Continued)

OTHER PUBLICATIONS

Notice of Office Action issued in corresponding Korean Patent Application No. 10-2014-0124380, dated May 18, 2017; with English translation.

*Primary Examiner* — Tsz Chan
(74) *Attorney, Agent, or Firm* — McDermott Will & Emery LLP

(57) ABSTRACT

There is provided a chip electronic component including: an insulating substrate; a first coil part disposed on one surface of the insulating substrate; a second coil part disposed on the other surface of the insulating substrate opposing one surface of the insulating substrate; a via connecting the first and second internal coil parts to each other while penetrating through the insulating substrate; first and second via pads disposed on one surface and the other surface of the insulating substrate, respectively, so as to cover the via; and a first dummy pattern disposed in a region of one surface of the insulating substrate adjacent to the first via pad and a second dummy pattern disposed in a region of the other surface of the insulating substrate adjacent to the second via pad.

16 Claims, 6 Drawing Sheets

100 55 50 I 61 20 81 43 47 I' 46 41 42 82 44 62 T W L 43 61 46 41 50

(51) Int. Cl.
*H01F 27/29* (2006.01)
*H05K 1/18* (2006.01)
*H05K 3/34* (2006.01)

(52) U.S. Cl.
CPC ........ *H01F 2017/048* (2013.01); *H05K 1/181* (2013.01); *H05K 3/3442* (2013.01); *H05K 2201/1003* (2013.01)

(58) Field of Classification Search
USPC .................................................. 336/200, 232
See application file for complete search history.

(56) References Cited

U.S. PATENT DOCUMENTS

| | | | | |
|---|---|---|---|---|
| 2007/0228515 | A1* | 10/2007 | Asahi | H01L 23/522 257/531 |
| 2011/0241816 | A1* | 10/2011 | Park | H01F 27/2804 336/200 |
| 2013/0088316 | A1* | 4/2013 | Odahara | H01F 17/0013 336/200 |
| 2013/0222101 | A1* | 8/2013 | Ito | H01F 17/04 336/83 |
| 2016/0078998 | A1* | 3/2016 | Park | H01F 17/0013 336/105 |

FOREIGN PATENT DOCUMENTS

| | | | | |
|---|---|---|---|---|
| JP | 2005109097 | A | * | 4/2005 |
| JP | 2007-067214 | A | | 3/2007 |
| JP | 2007-273577 | A | | 10/2007 |
| JP | 2009064785 | A | * | 3/2009 |
| JP | 2010205905 | A | * | 9/2010 |
| JP | 2012182286 | A | * | 9/2012 |
| JP | 2014-013815 | A | | 1/2014 |
| KR | 10-2000-0020822 | A | | 4/2000 |

* cited by examiner

CHIP ELECTRONIC COMPONENT AND BOARD HAVING THE SAME

CROSS-REFERENCE TO RELATED APPLICATION

This application claims the priority and benefit of Korean Patent Application No. 10-2014-0124380 filed on Sep. 18, 2014, with the Korean Intellectual Property Office, the disclosure of which is incorporated herein by reference.

BACKGROUND

The present disclosure relates to a chip electronic component and a board having the same.

An inductor, a chip electronic component, is a representative passive element configuring an electronic circuit, together with a resistor and a capacitor, to remove noise.

A thin film type inductor is manufactured by forming internal coil parts by plating, forming a magnetic body by hardening a magnetic powder-resin composite obtained by mixing a magnetic power and a resin with each other, and forming external electrodes on outer surfaces of the magnetic body.

RELATED ART DOCUMENT

Patent Document (Patent Document 1) Japanese Patent Laid-Open Publication No. 2007-067214

SUMMARY

An aspect of the present disclosure may provide a chip electronic component in which short-circuits due to excessive growth of via pads and loss of inductance due to increased areas of via pads are respectively prevented by suppressing the excessive growth of the via pads.

According to an aspect of the present disclosure, a chip electronic component may include: an insulating substrate; a first coil part disposed on one surface of the insulating substrate; a second coil part disposed on the other surface of the insulating substrate opposing one surface of the insulating substrate; a via connecting the first and second internal coil parts to each other while penetrating through the insulating substrate; first and second via pads disposed on one surface and the other surface of the insulating substrate, respectively, so as to cover the via; and a first dummy pattern disposed in a region of one surface of the insulating substrate adjacent to the first via pad, and a second dummy pattern disposed in a region of the other surface of the insulating substrate adjacent to the second via pad.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
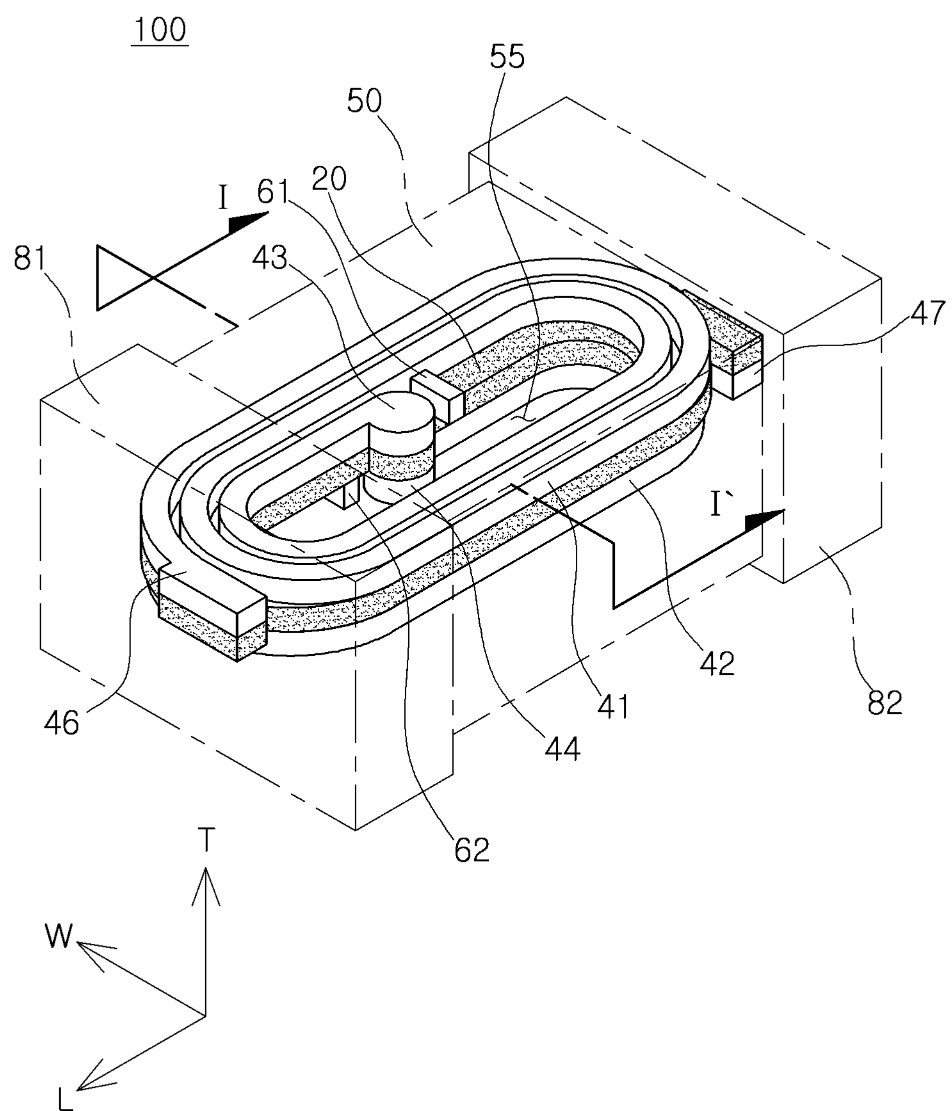
FIG. 1 is a schematic perspective view of a chip electronic component including internal coil parts according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Chip Electronic Component

Hereinafter, a chip electronic component according to an exemplary embodiment of the present disclosure, particularly, a thin film type inductor will be described. However, the present inventive concept is not necessarily limited thereto.

FIG. 1 is a schematic perspective view of a chip electronic component including internal coil parts according to an exemplary embodiment of the present disclosure.

Referring to FIG. 1, a thin film type inductor used in a power line of a power supplying circuit is disclosed as an example of a chip electronic component.

A chip electronic component 100 according to an exemplary embodiment of the present disclosure may include a magnetic body 50, internal coil parts 41 and 42 buried in the magnetic body 50, and first and second external electrodes 81 and 82 disposed on outer surfaces of the magnetic body 50 and electrically connected to the internal coil parts 41 and 42.

In the chip electronic component 100 according to an exemplary embodiment of the present disclosure, a 'length' direction refers to an 'L' direction of FIG. 1, a 'width' direction refers to a 'W' direction of FIG. 1, and a 'thickness' direction refers to a 'T' direction of FIG. 1.

The magnetic body 50 may form an appearance of the chip electronic inductor 100 and may be formed of any material that exhibits a magnetic property. For example, the magnetic body 50 may be formed using a ferritic or a magnetic metal powder.

The ferrite may be, for example, Mn—Zn based ferrite, Ni—Zn based ferrite, Ni—Zn—Cu based ferrite, Mn—Mg based ferrite, Ba based ferrite, Li based ferrite, or the like.

The magnetic metal powder may contain one or more selected from the group consisting of Fe, Si, Cr, Al, and Ni. For example, the magnetic metal powder may be a Fe—Si—B—Cr based amorphous metal, but is not necessarily limited thereto.

The magnetic metal powder may have an average particle diameter of 0.1 to 30 μm and may be contained in a thermosetting resin such as an epoxy resin, polyimide, or the like, in a form in which they are dispersed in the thermosetting resin.

A first internal coil part 41 having a coil shape may be formed on one surface of an insulating substrate 20 disposed in the magnetic body 50, and a second internal coil part 42 having a coil shape may be formed on the other surface of the insulating surface 20 opposing one surface of the insulating substrate 20.

The first and second internal coil parts 41 and 42 may have a spiral shape and be formed by an electroplating method.

The insulating substrate 20 may be, for example, a polypropylene glycol (PPG) substrate, a ferrite substrate, a metal based soft magnetic substrate, or the like.

The insulating substrate 20 may have a through-hole formed in a central portion thereof so as to penetrate through the central portion thereof, wherein the through-hole may be filled with magnetic materials to form a core part 55. The core part 55 filled with the magnetic materials may be formed, thereby improving an inductance (Ls).

Figure 2:
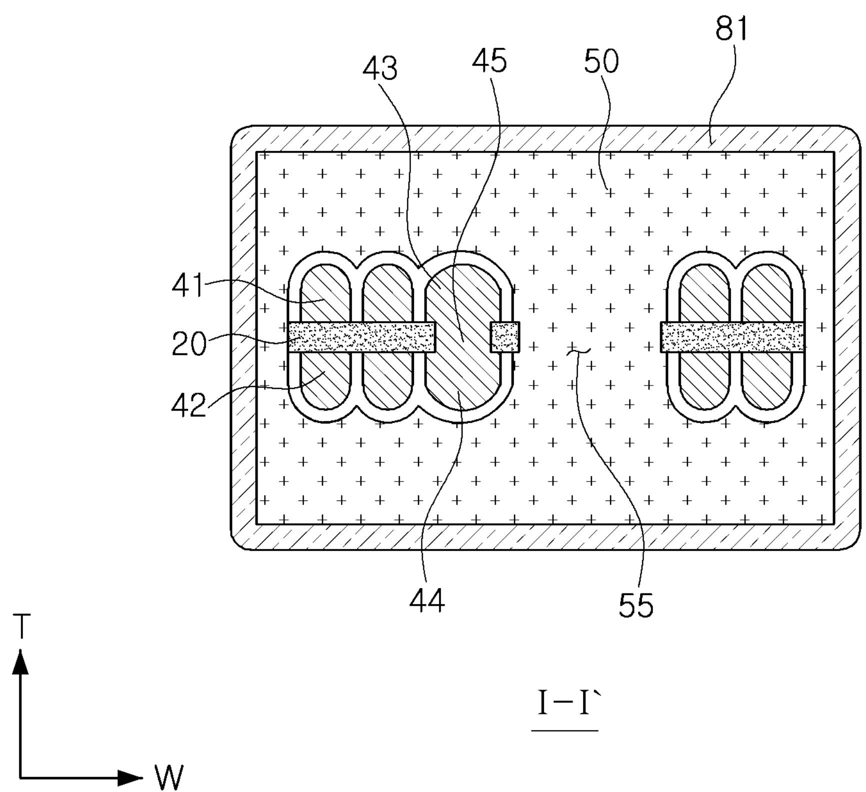
FIG. 2 is a cross-sectional view taken along line I-I' of FIG. 1.

FIG. 2 is a cross-sectional view taken along line I-I' of FIG. 1.

Referring to FIG. 2, the first and second internal coil parts 41 and 42 formed on one surface and the other surface of the insulating substrate 20, respectively, may be connected to each other by a via 45 penetrating through the insulating substrate 20.

First and second via pads 43 and 44 may be formed on one surface and the other surface of the insulating substrate 20, respectively, so as to cover the via 45.

The first via pad 43 may be formed by extending one end portion of the first internal coil part 41, and the second via pad 44 may be formed by extending one end portion of the second internal coil part 42.

The first and second via pads 43 and 44 may be formed by an electroplating method, similar to the first and second internal coil parts 41 and 42.

Here, since the via pads are formed at end portions of the internal coil parts, a more amount of plating solution may be present in regions in which the via pads are formed than in other regions of the internal coil parts at the time of performing a plating process. Therefore, the via pads may be excessively grown in the plating process of forming the via pads, such that a short-circuit may be generated between the via pads and the internal coil parts adjacent to the via pads and areas of the via pads may be increased. Therefore, an area of the core part may be decreased and the magnetic materials filled in the core part may be decreased, such that inductance (Ls) characteristics may be decreased.

Therefore, in an exemplary embodiment of the present disclosure, a first dummy pattern 61 may be formed in a region of one surface of the insulating substrate 20 adjacent to the first via pad 43 and a second dummy pattern 62 may be formed in a region of the other surface of the insulating substrate 20 adjacent to the second via pad 44, thereby solving the above-mentioned problem.

The first dummy pattern 61 may be disposed in the region of the insulating substrate 20 which is adjacent to and spaced apart from the first via pad 43 by a predetermined interval, and the second dummy pattern 62 may be disposed in the region of the insulating substrate 20 which is adjacent to the second via pad 44 and spaced apart from the second via pad 44 by a predetermined interval.

The first and second dummy patterns 61 and 62 formed in the regions adjacent to the first and second via pads 43 and 44 so as to be spaced apart from the first and second via pads 43 and 44 by the predetermined intervals, respectively, may serve to suppress permeation of an excessive amount of plating solution at the time of performing the plating process of forming the via pads.

Therefore, the first and second dummy patterns 61 and 62 may be formed to suppress excessive growth of the first and second via pads 43 and 44 and prevent a short-circuit due to the excessive growth of the via pads. In addition, sizes of the first and second via pads 43 and 44 may be decreased, such that an area of the core part 55 filled with the magnetic materials may be increased, thereby implementing a high inductance (Ls).

Figure 3A:
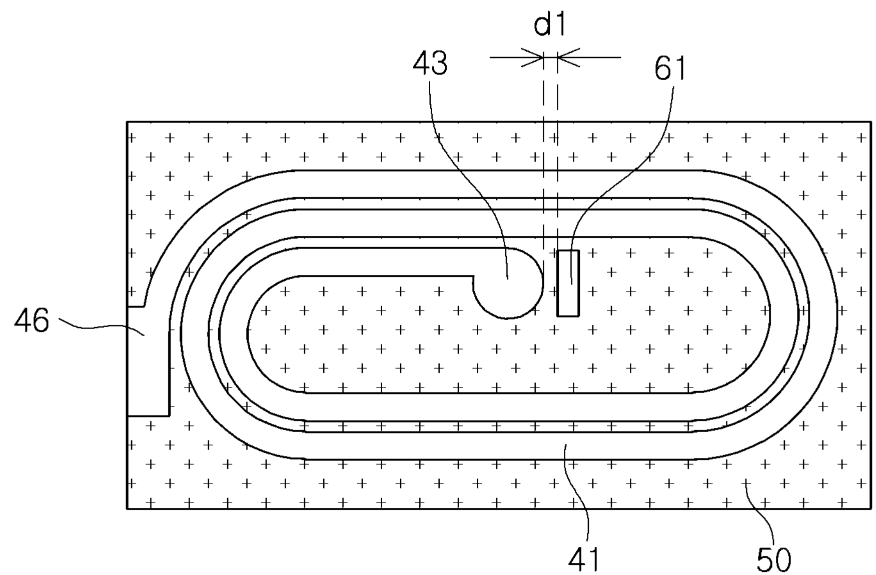
FIGS. 3A and 3B are schematic plan views of via pads and dummy patterns according to an exemplary embodiment of the present disclosure.
Figure 3B:
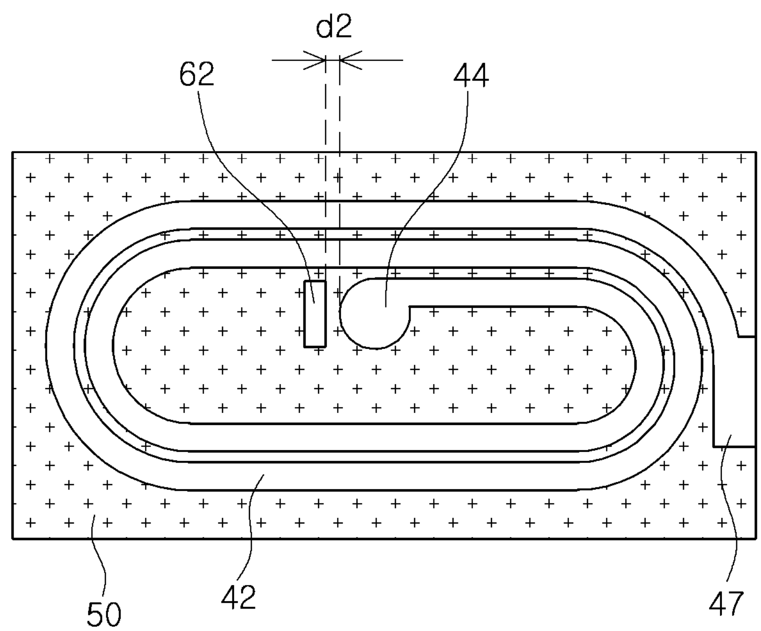

FIGS. 3A and 3B are schematic plan views of via pads and dummy patterns according to an exemplary embodiment of the present disclosure.

Referring to FIGS. 3A and 3B, the first and second dummy patterns 61 and 62 may be disposed so as to be spaced apart from the first and second internal coil parts 41 and 42, respectively.

The first and second dummy patterns 61 and 62 may be disposed so as to be spaced apart from the first and second internal coil parts 41 and 42, such that they may not be electrically connected to the internal coil parts 41 and 42, and may serve to suppress the permeation of the excessive amount of plating solution at the time of performing the plating process of forming the via pads.

A minimum interval d1 between the first dummy pattern 61 and the first via pad 43 and a minimum interval d2 between the second dummy pattern 62 and the second via pad 44 may be 5 μm or more.

In the case in which the minimum intervals d1 and d2 between the first and second dummy patterns 61 and 62 and the first and second via pads 43 and 44 are less than 5 μm, a short-circuit may be generated between the first and second dummy patterns 61 and 62 and the first and second via pads 43 and 44.

Figure 4A:
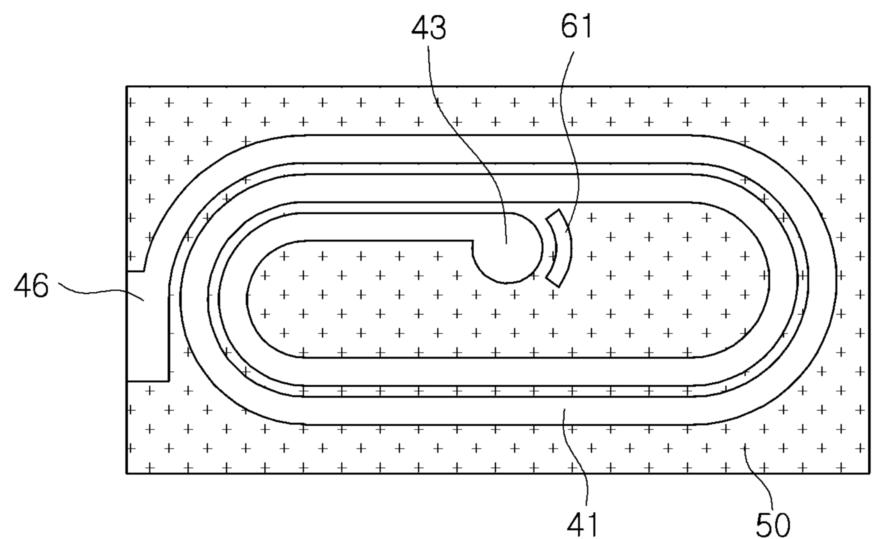
FIGS. 4A and 4B are schematic plan views of via pads and dummy patterns according to another exemplary embodiment of the present disclosure.
Figure 4B:
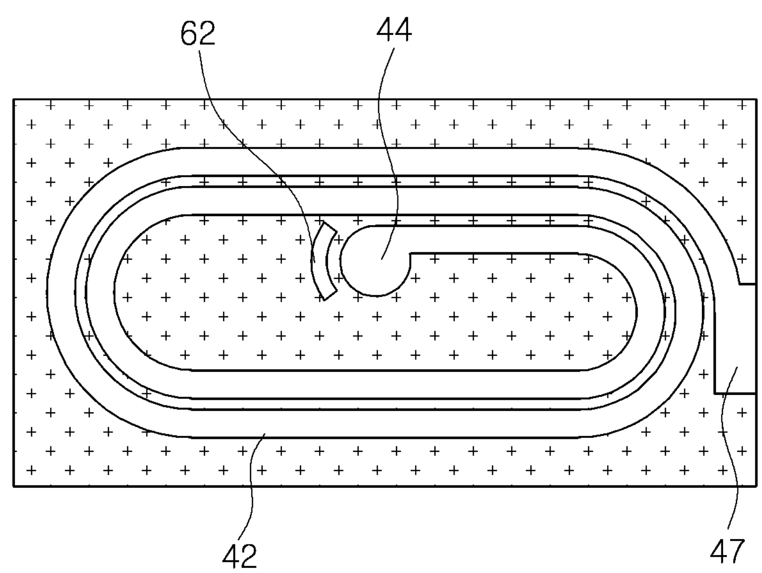

FIGS. 4A and 4B are schematic plan views of via pads and dummy patterns according to another exemplary embodiment of the present disclosure.

Referring to FIGS. 4A and 4B, first and second dummy patterns 61 and 62 according to another exemplary embodiment of the present disclosure may be formed in a curved surface shape depending on a shape of the first and second via pads 43 and 44.

Although the case in which the first and second dummy patterns 61 and 62 have a rectangular pillar shape has been shown in FIGS. 3A and 3B and the case in which the first and second dummy patterns 61 and 62 have the curved surface shape has been shown in FIGS. 4A and 4B, the present inventive concept is not limited thereto.

That is, shapes of the first and second dummy patterns 61 and 62 may be changed by those skilled in the art as long as the first and second dummy patterns 61 and 62 may be disposed in the regions adjacent to the first and second via pads 43 and 44 so as to be spaced apart from the first and second via pads 43 and 44 by predetermined intervals to serve to suppress the permeation of the excessive amount of plating solution at the time of performing the plating process of forming the via pads.

The first and second internal coil parts 41 and 42, the via 45, the first and second via pads 43 and 44, and the first and second dummy patterns 61 and 62 may be formed of a metal having excellent electrical conductivity, for example, silver (Ag), palladium (Pd), aluminum (Al), nickel (Ni), titanium (Ti), gold (Au), copper (Cu), platinum (Pt), or an alloy thereof, etc.

The other end portion of the first internal coil part 41 may be extended to form a first lead portion 46 exposed to one end surface of the magnetic body 50 in the length (L) direction, and the other end portion of the second internal coil part 42 may be extended to form a second lead portion 47 exposed to the other end surface of the magnetic body 50 in the length (L) direction.

The first and second external electrodes 81 and 82 may be disposed on both end surfaces of the magnetic body 50 in the length (L) direction, respectively, so as to be connected to the first and second lead portions 46 and 47 exposed to both end surfaces of the magnetic body 50 in the length (L) direction, respectively.

The first and second external electrodes 81 and 82 may be formed of a metal having excellent electrical conductivity, for example, nickel (Ni), copper (Cu), tin (Sn), silver (Ag), or the like, or an alloy thereof, etc.

Board Having Chip Electronic Component

Figure 5:
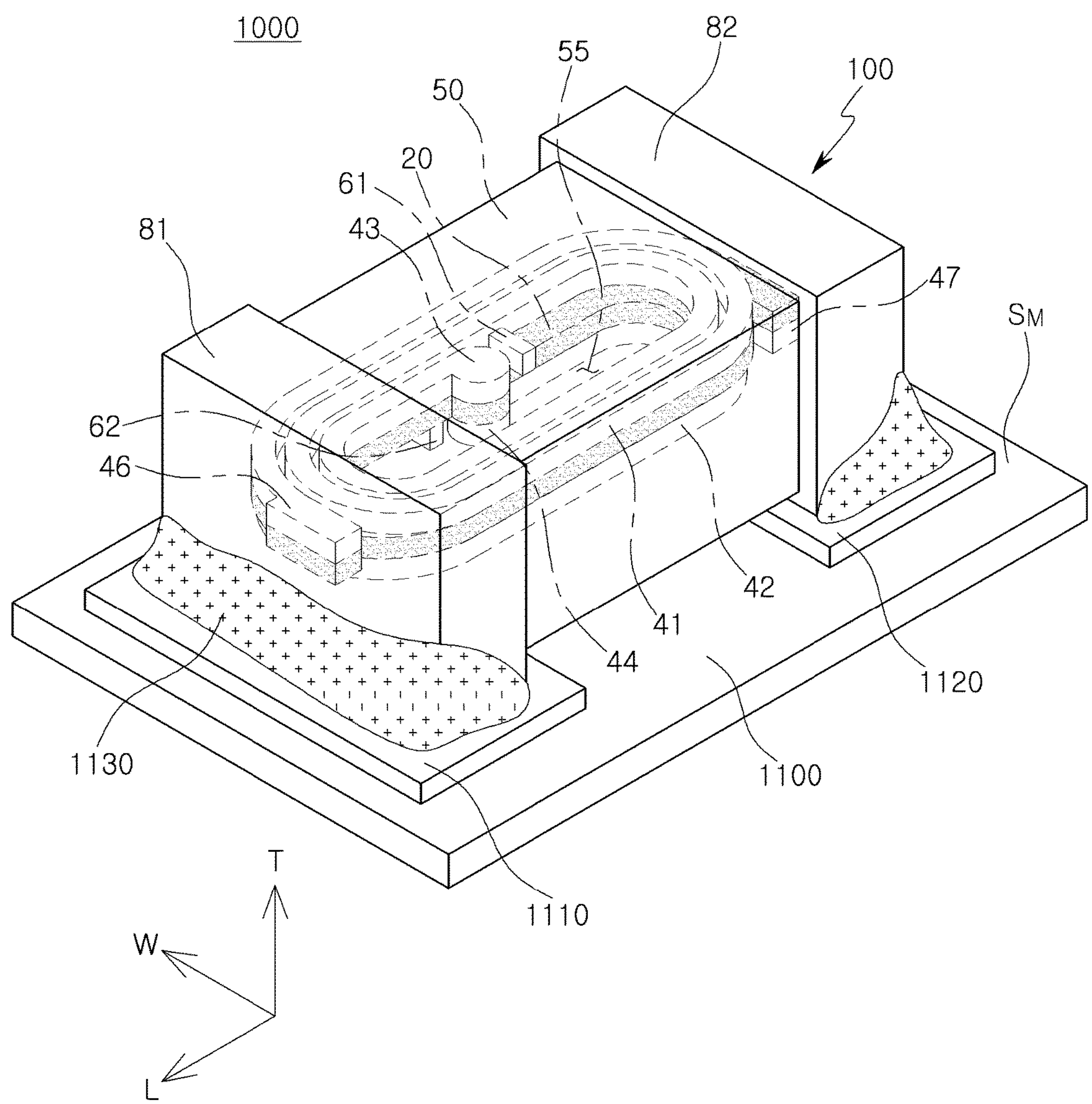
FIG. 5 is a perspective view showing a board in which the chip electronic component of FIG. 1 is mounted on a printed circuit board.

FIG. 5 is a perspective view of a board in which the chip electronic component of FIG. 1 is mounted on a printed circuit board.

Referring to FIG. 5, a board 1000 having a chip electronic component 100 according to an exemplary embodiment of the present disclosure may include a printed circuit board 1100 on which the chip electronic component 100 is mounted and first and second electrode pads 1110 and 1120 formed on an upper surface of the printed circuit board 1100 so as to be spaced apart from each other.

Here, the chip electronic component 100 may be electrically connected to the printed circuit board 1100 by solders 1130 in a state in which the first and second external electrodes 81 and 82 formed on both end surfaces thereof are positioned on the first and second electrode pads 1110 and 1120, respectively, so as to contact the first and second electrode pads 1110 and 1120, respectively.

The internal coil parts 41 and 42 of the chip electronic component 100 mounted on the printed circuit board may be disposed to be parallel to amounting surface ($S_M$) of the printed circuit board 1100.

Figure 6:
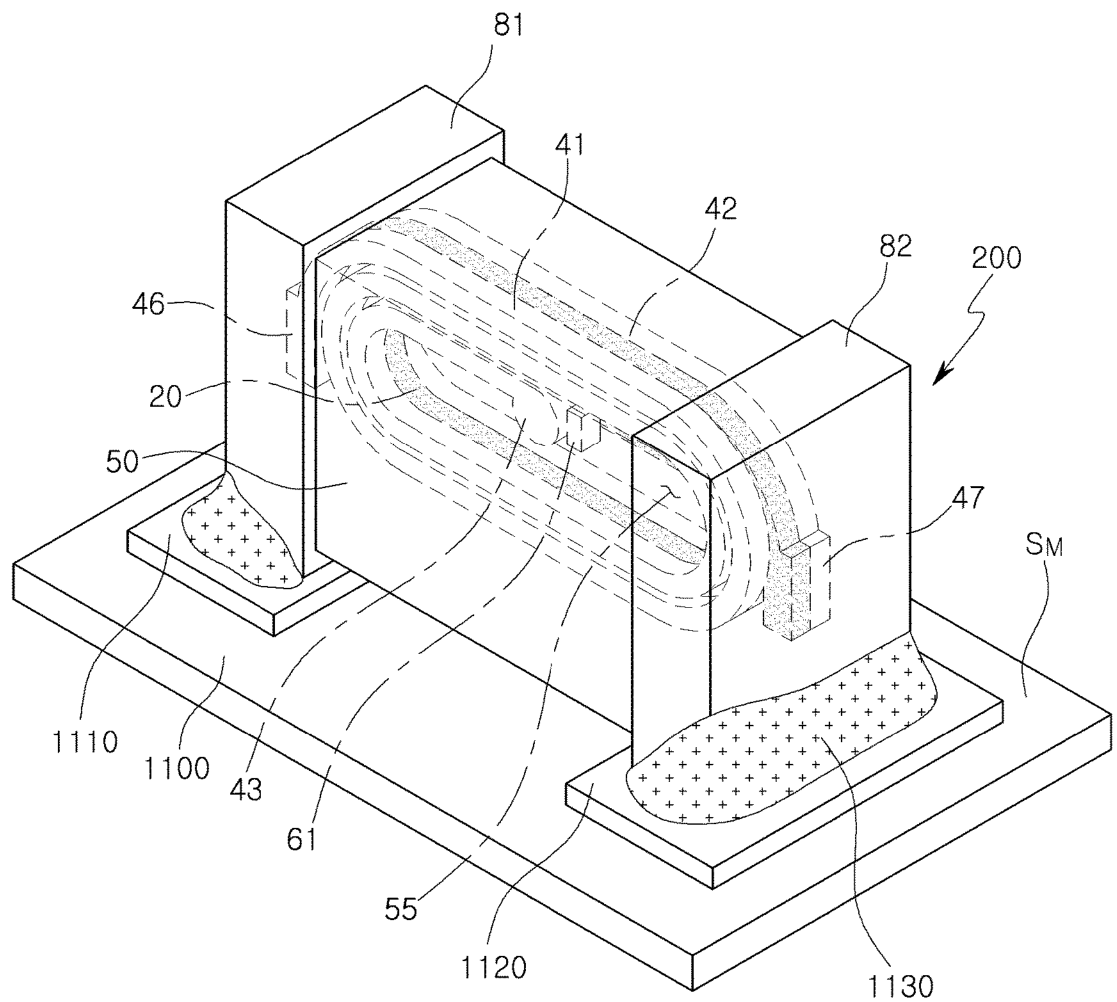
FIG. 6 is a perspective view showing a board in which a chip electronic component is mounted on a printed circuit board, according to another exemplary embodiment of the present disclosure.

FIG. 6 is a perspective view of a board in which a chip electronic component is mounted on a printed circuit board, according to another exemplary embodiment of the present disclosure.

Referring to FIG. 6, in a board 1000 having a chip electronic component 200 according to another exemplary embodiment of the present disclosure, the internal coil parts 41 and 42 of the chip electronic component 200 mounted on the printed circuit board may be disposed to be perpendicular to a mounting surface ($S_M$) of the printed circuit board 1100.

A description for features overlapped with those of the chip electronic component according to an exemplary embodiment of the present disclosure described above except for the above-mentioned description will be omitted.

As set forth above, according to exemplary embodiments of the present disclosure, the excessive growth of the via pads may be suppressed.

Therefore, the short-circuits due to the excessive growth of the via pads may be prevented, and loss of inductance due to increased areas of the via pads may be prevented.

While exemplary embodiments have been shown and described above, it will be apparent to those skilled in the art that modifications and variations could be made without departing from the scope of the present invention as defined by the appended claims.

What is claimed is:

1. A chip electronic component comprising:
an insulating substrate;
a first coil part disposed on one surface of the insulating substrate;
a second coil part disposed on the other surface of the insulating substrate opposing the one surface of the insulating substrate;
a via connecting the first and second internal coil parts to each other while penetrating through the insulating substrate;
first and second via pads disposed on the one surface and the other surface of the insulating substrate, respectively, so as to cover the via; and
a first dummy pattern disposed in a region of the one surface of the insulating substrate adjacent to the first via pad, and a second dummy pattern disposed in a region of the other surface of the insulating substrate adjacent to the second via pad,
wherein the first and second dummy patterns are physically and electrically separated from each other,
portions of the first and second via pads facing the first and second dummy patterns, respectively, are formed to have a curved surface, and
the first and second dummy patterns are formed to have a curved shape, depending on a shape of the first and second via pads, respectively.

2. The chip electronic component of claim 1, wherein the first via pad is formed by extending one end portion of the first internal coil part, and
the second via pad is formed by extending one end portion of the second coil part.

3. The chip electronic component of claim 1, wherein the first and second dummy patterns are disposed to be spaced apart from the first and second internal coil parts, respectively.

4. The chip electronic component of claim 1, wherein the first dummy pattern and the first via pad have a minimum interval of 5 μm or more therebetween, and
the second dummy pattern and the second via pad have a minimum interval of 5 μm or more therebetween.

5. The chip electronic component of claim 1, wherein the first and second dummy patterns contain one or more selected from the group consisting of silver (Ag), palladium (Pd), aluminum (Al), nickel (Ni), titanium (Ti), gold (Au), copper (Cu), and platinum (Pt).

6. The chip electronic component of claim 1, further comprising a magnetic body enclosing the first and second coil parts,
wherein the magnetic body contains a magnetic metal powder.

7. The chip electronic component of claim 1, wherein the insulating substrate has a through-hole which is disposed in a central portion thereof, and
the through-hole is filled with a magnetic material to form a core part.

8. The chip electronic component of claim 6, wherein end portions of the first and second internal coil parts are extended to form lead portions exposed to at least one surface of the magnetic body.

9. A board having a chip electronic component, comprising:
a printed circuit board having first and second electrode pads disposed thereon; and the chip electronic component of claim 1 installed on the printed circuit board.

10. The board of claim 9, wherein the first and second internal coil parts are disposed to be parallel to a mounting surface of the printed circuit board.

11. The board of claim 9, wherein the first and second internal coil parts are disposed to be perpendicular to a mounting surface of the printed circuit board.

12. A chip electronic component comprising:

a magnetic body including an insulating substrate;

a first coil part disposed on one surface of the insulating substrate;

a second coil part disposed on the other surface of the insulating substrate opposing the one surface of the insulating substrate;

a via connecting the first and second internal coil parts to each other while penetrating through the insulating substrate;

first and second via pads formed by extending one end portions of the first and second internal coil parts, respectively, so as to cover the via; and a first dummy pattern disposed in a region of the insulating substrate which is adjacent to and spaced apart from the first via pad by a predetermined interval, and a second dummy pattern disposed in a region of the insulating substrate which is adjacent to and spaced apart from the second via pad by a predetermined interval, wherein the first and second dummy patterns are physically and electrically separated from each other, portions of the first and second via pads facing the first and second dummy patterns, respectively, are formed to have a curved surface, and the first and second dummy patterns are formed to have a curved shape, depending on a shape of the first and second via pads, respectively.

13. The chip electronic component of claim 12, wherein the first dummy pattern and the first via pad have a minimum interval of 5 μm or more therebetween, and the second dummy pattern and the second via pad have a minimum interval of 5 μm or more.

14. The chip electronic component of claim 12, wherein the first and second dummy patterns are disposed to be spaced apart from the first and second internal coil parts, respectively.

15. The chip electronic component of claim 12, wherein the insulating substrate has a through-hole which is disposed in a central portion thereof, and the through-hole is filled with a magnetic material to form a core part.

16. The chip electronic component of claim 12, wherein end portions of the first and second internal coil parts are extended to form lead portions exposed to at least one surface of the magnetic body.

* * * * *